US011067652B2

(12) United States Patent
Fukushima

(10) Patent No.: US 11,067,652 B2
(45) Date of Patent: Jul. 20, 2021

(54) RADIO FREQUENCY COIL

(71) Applicant: CANON MEDICAL SYSTEMS CORPORATION, Otawara (JP)

(72) Inventor: Masahiro Fukushima, Utsunomiya (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 16/750,059

(22) Filed: Jan. 23, 2020

(65) Prior Publication Data
US 2020/0241089 A1 Jul. 30, 2020

(30) Foreign Application Priority Data

Jan. 29, 2019 (JP) .............................. JP2019-012776

(51) Int. Cl.
*G01R 33/3415* (2006.01)
*G01R 33/36* (2006.01)
*G01R 33/34* (2006.01)
*G01R 33/385* (2006.01)

(52) U.S. Cl.
CPC ... *G01R 33/3415* (2013.01); *G01R 33/34007* (2013.01); *G01R 33/34084* (2013.01); *G01R 33/365* (2013.01); *G01R 33/385* (2013.01)

(58) Field of Classification Search
CPC .............. G01R 33/3415; G01R 33/365; G01R 33/34007; G01R 33/385; G01R 33/34084
See application file for complete search history.

(56) References Cited

U.S. PATENT DOCUMENTS

| 5,327,898 A * | 7/1994 | Yoshino ............. G01R 33/3678 324/318 |
| 2006/0208734 A1* | 9/2006 | Xue ..................... G01R 33/341 324/318 |
| 2008/0238424 A1* | 10/2008 | Possanzini ......... G01R 33/3415 324/318 |
| 2019/0041476 A1 | 2/2019 | Otake et al. |

FOREIGN PATENT DOCUMENTS

JP 2017-153860 A 9/2017

* cited by examiner

*Primary Examiner* — G. M. A Hyder
(74) *Attorney, Agent, or Firm* — Oblon, McClelland, Maier & Neustadt, L.L.P.

(57) ABSTRACT

A radio frequency coil according to an embodiment configured to receive a magnetic resonance signal from a subject by a plurality of coil elements including a first coil element and a second coil element. The first coil element and the second coil element are supported by a first housing and a second housing, the first housing and the second housing being rigid. The first housing and the second housing are connected by a flexible connector. The first coil element overlaps the second coil element at least part of the connector.

8 Claims, 12 Drawing Sheets

C-C

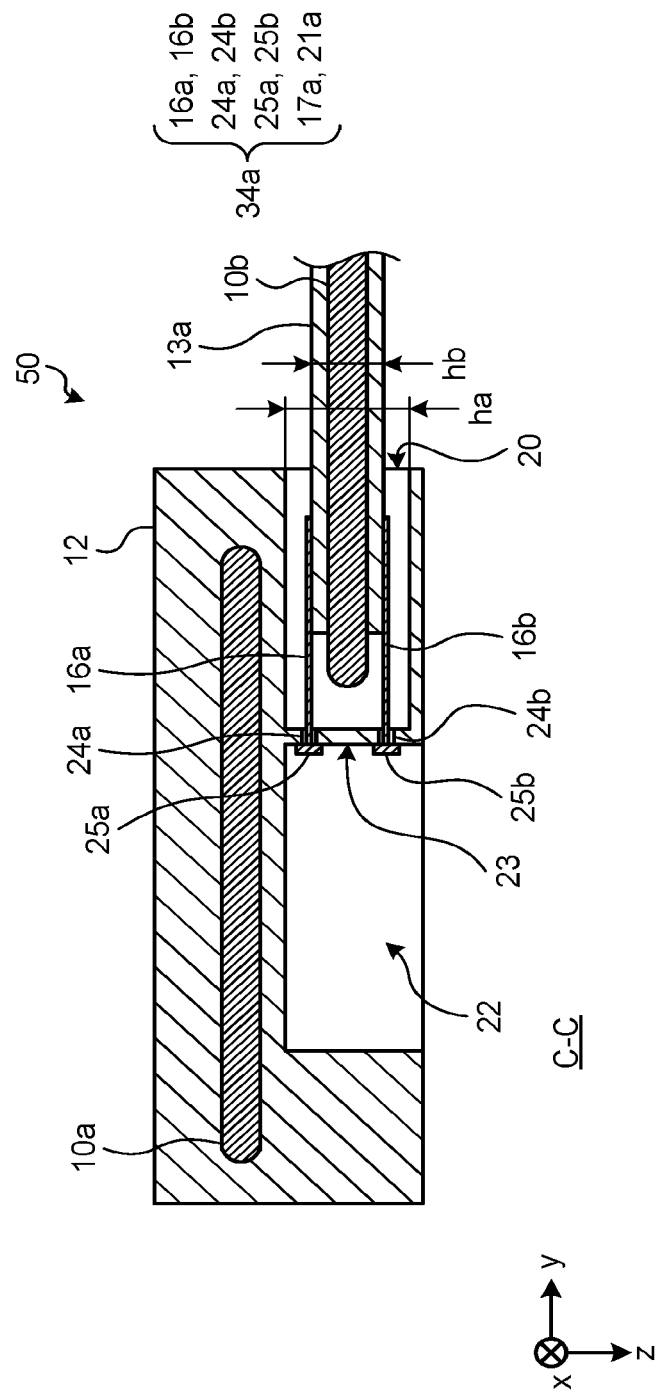

RADIO FREQUENCY COIL

CROSS-REFERENCE TO RELATED APPLICATIONS

This application is based upon and claims the benefit of priority from Japanese Patent Application No. 2019-012776, filed on Jan. 29, 2019; the entire contents of which are incorporated herein by reference.

FIELD

Embodiments described herein relate generally to a radio frequency coil.

BACKGROUND

In magnetic resonance imaging using magnetic resonance phenomena, a magnetic resonance imaging apparatus (hereinafter, referred to as an "MRI apparatus") applies a gradient magnetic field and a radio frequency magnetic field for determining a cross section to be imaged to a subject placed in a static magnetic field. The MRI apparatus collects magnetic resonance signals (MR signals) generated from atomic nuclei excited by the radio frequency magnetic field while applying the gradient magnetic field for adding positional information.

A receiving coil (radio frequency coil) that receives the MR signals is provided as an array coil including a plurality of coil elements (hereinafter, referred to as elements). The MRI apparatus synthesizes the MR signals received by the elements to generate an MR image.

The receiving coil is preferably disposed in close contact with the subject. To bring the receiving coil into close contact with the subject's body, it is necessary to bend the receiving coil because the body of a patient serving as the subject usually has an uneven surface. If coupling occurs between elements disposed side by side in the receiving coil, a radio frequency current flowing in one element causes a radio frequency current, that is, an induced current to flow in another element. As a result, the signal-to-noise ratio (SNR) of the MR image decreases. To address this, conventionally developed is a receiving coil with joints provided between elements disposed side by side to bring the receiving coil into close contact with a subject and having a decoupling function for suppressing coupling.

The conventional receiving coil, however, fails to receive the MR signals at the joints because the joints do not have a receiving function. As a result, the conventional technique fails to capture the MR image at the joints.

In view of the disadvantages described above, an object of the present invention is to provide a receiving coil having higher receiving performance.

BRIEF DESCRIPTION OF THE DRAWINGS

FIG. 7B is a second view of the exemplary structure of the first connector;

DETAILED DESCRIPTION

A radio frequency coil according to an embodiment configured to receive a magnetic resonance signal from a subject by a plurality of coil elements including a first coil element and a second coil element. The first coil element and the second coil element are supported by a first housing and a second housing, the first housing and the second housing being rigid. The first housing and the second housing are connected by a flexible connector. The first coil element overlaps the second coil element at least part of the connector.

Exemplary embodiments of a radio frequency coil are described below in greater detail with reference to the accompanying drawings. The radio frequency coil according to the present application is not limited to the embodiments described below.

Explanation of the MRI Apparatus

Figure 1:
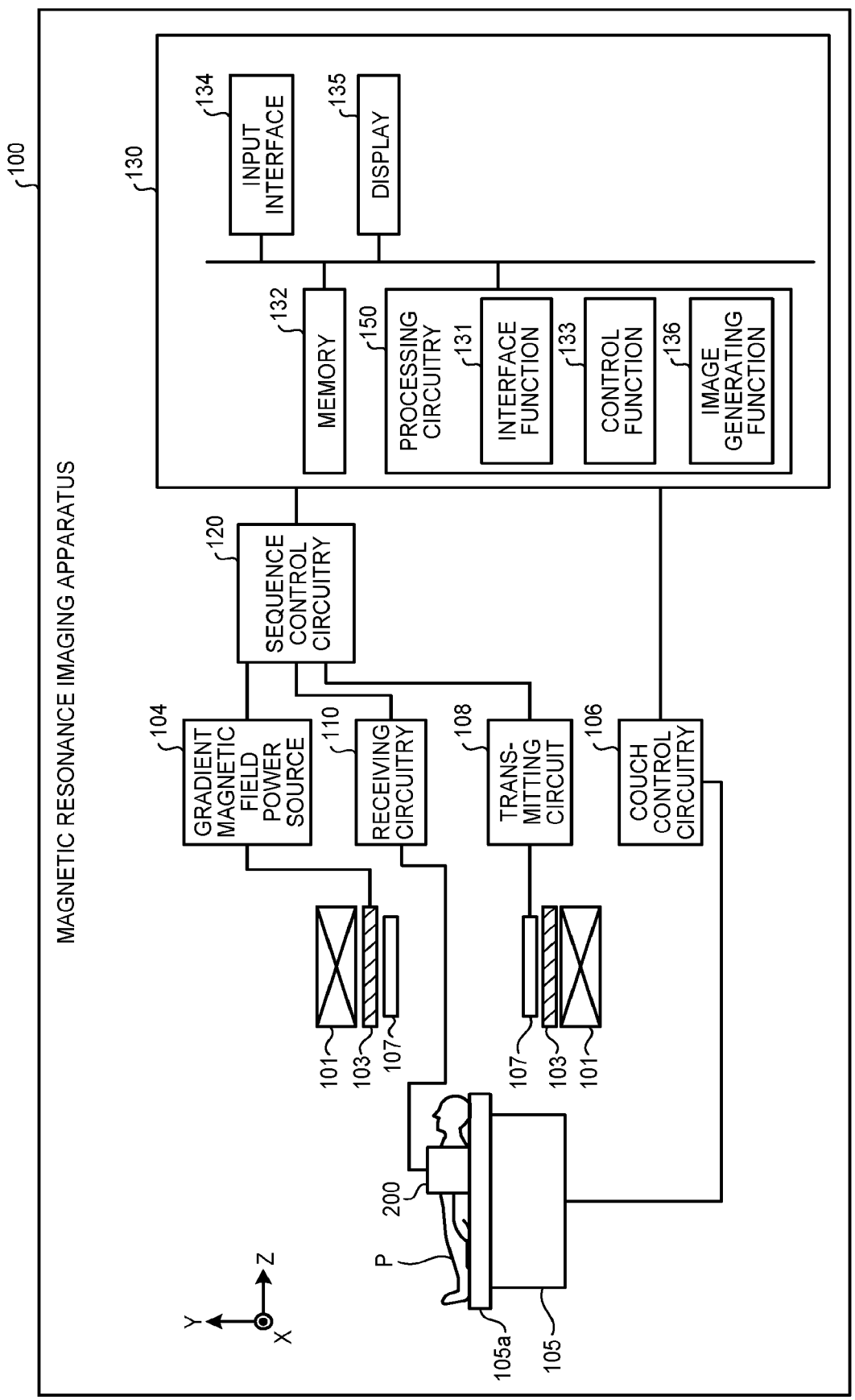
FIG. 1 is a block diagram of an example of an MRI apparatus with an array coil.

An example of a magnetic resonance imaging (MRI) apparatus 100 with an array coil 200 according to an embodiment is described with reference to FIG. 1. FIG. 1 is a block diagram of an example of the MRI apparatus 100 with the array coil 200.

As illustrated in FIG. 1, the MRI apparatus 100 includes a static magnetic field magnet 101, a static magnetic field power source (not illustrated), a gradient coil 103, a gradient magnetic field power source 104, a couch 105, couch control circuitry 106, a transmitting coil 107, transmitting circuitry 108, the array coil 200, receiving circuitry 110, sequence control circuitry 120, and a computer 130. The configuration illustrated in FIG. 1 is given by way of example only. The components in the sequence control circuitry 120 and the computer 130, for example, may be appropriately integrated or separated.

The static magnetic field magnet 101 is a hollow magnet having a substantially tubular shape and generates a static magnetic field in the internal space. The static magnetic field magnet 101 is a superconducting magnet, for example, and receives an electric current from the static magnetic field power source, thereby being excited. The static magnetic field power source supplies an electric current to the static magnetic field magnet 101. Alternatively, the static magnetic field magnet 101 may be a permanent magnet, for example. In this case, the MRI apparatus 100 does not necessarily include the static magnetic field power source. The static magnetic field power source may be provided independently of the MRI apparatus 100.

The gradient coil 103 is a hollow coil having a substantially tubular shape and is disposed inside the static magnetic field magnet 101. The gradient coil 103 is a combination of three coils corresponding to X-, Y-, and Z-axes orthogonal to one another. These three coils are each supplied with an electric current from the gradient magnetic field power source 104 and generate a gradient magnetic field having the magnetic field strength varying along the X-, Y-, and Z-axes. The gradient magnetic field power source 104 supplies an electric current to the gradient coil 103.

The couch 105 includes a couchtop 105a on which a subject P is placed. The couch 105 inserts the couchtop 105a into a bore (imaging port) of the gradient coil 103 with the subject P, such as a patient, placed thereon under the control of the couch control circuitry 106. The couch 105 is usually installed with its longitudinal direction extending in parallel with the central axis of the static magnetic field magnet 101. The couch control circuitry 106 drives the couch 105 and moves the couchtop 105a in the longitudinal direction and the vertical direction under the control of the computer 130.

The transmitting coil 107 is disposed inside the gradient coil 103 and receives RF pulses from the transmitting circuitry 108 to generate a radio frequency magnetic field. The transmitting circuitry 108 supplies the transmitting coil 107 with RF pulses corresponding to a Larmor frequency determined by the type and the magnetic field strength of the atoms to be excited.

The array coil 200 is composed of a plurality of small receiving coils (elements). The array coil 200 is disposed inside the gradient coil 103. In imaging performed by the MRI apparatus, the array coil 200 receives magnetic resonance signals (MR signals) output from the subject P due to the effects of the radio frequency magnetic field. When receiving the MR signals, the array coil 200 outputs the received MR signals to the receiving circuitry 110. The array coil 200 is frequently designed to collect the signals from a specific body part (e.g., head, abdomen, arm, shoulder, wrist, knee, leg, and backbone) depending on the imaging region. The array coil 200 is an example of a radio frequency coil.

The array coil 200 includes a plurality of elements, predetermined circuitry element, and a preamplifier, for example. In the elements, element coils extract signals by LC resonance. The predetermined circuitry element performs impedance matching. The preamplifier amplifies signals. The signals extracted by the element coils included in the array coil 200 are amplified by the preamplifier, for example, and output to the receiving circuitry 110 in units of what is called channels, for example.

The receiving circuitry 110 detects the MR signals output from the array coil 200 and generates magnetic resonance image data (MR image) based on the detected MR signals. Specifically, the receiving circuitry 110 converts the MR signals output from the array coil 200 into digital signals, thereby generating MR data. The receiving circuitry 110 transmits the generated MR data to the sequence control circuitry 120. The receiving circuitry 110 may be provided to the base device including the static magnetic field magnet 101 and the gradient coil 103, for example.

The sequence control circuitry 120 drives the gradient magnetic field power source 104, the transmitting circuitry 108, and the receiving circuitry 110 based on sequence information transmitted from the computer 130, thereby imaging the subject P. The sequence information defines the procedure for performing imaging. The sequence information defines the following items: the strength of the electric current supplied from the gradient magnetic field power source 104 to the gradient coil 103 and the timing for supplying the electric current, the strength of the RF pulses supplied from the transmitting circuitry 108 to the transmitting coil 107 and the timing for applying the RF pulses, and the timing for detecting the MR signals by the receiving circuitry 110, for example. The sequence control circuitry 120 is an integrated circuit, such as an application specific integrated circuit (ASIC) and a field programmable gate array (FPGA), or an electronic circuit, such as a central processing unit (CPU) and a micro processing unit (MPU).

When the sequence control circuitry 120 drives the gradient magnetic field power source 104, the transmitting circuitry 108, and the receiving circuitry 110 to image the subject P and receives MR data from the receiving circuitry 110, the sequence control circuitry 120 transfers the received MR data to the computer 130.

The computer 130 collectively controls the MRI apparatus 100 and generates MR images, for example. The computer 130 includes a memory 132, an input interface 134, a display 135, and processing circuitry 150. The processing circuitry 150 includes an interface function 131, a control function 133, and an image generating function 136.

The memory 132 stores therein MR data received by the processing circuitry 150 including the interface function 131 and image data generated by the processing circuitry 150 including the image generating function 136, for example. The memory 132 is a semiconductor memory device, such as a random access memory (RAM) and a flash memory, a hard disk, or an optical disc, for example.

The input interface 134 receives various instructions and input of information from an operator. The input interface 134 is a pointing device, such as a mouse and a trackball, a selection device, such as a mode changing switch, or an input device, such as a keyboard. The display 135 displays a graphical user interface (GUI) for receiving input of imaging conditions and an image generated by the processing circuitry 150 including the image generating function 136, for example, under the control of the processing circuitry 150 including the control function 133. The display 135 is a display device, such as a liquid crystal display.

The processing circuitry 150 transmits the sequence information to the sequence control circuitry 120 and receives MR data from the sequence control circuitry 120 by the interface function 131. When receiving MR data, the processing circuitry 150 including the interface function 131 stores the received MR data in the memory 132. The MR data stored in the memory 132 is disposed in a k-space having a relation of Fourier transform with image data in an actual space by the control function 133. As a result, the memory 132 stores therein k-space data.

The memory 132 stores therein the MR data received by the processing circuitry 150 including the interface function 131, the k-space data disposed in the k-space by the processing circuitry 150 including the control function 133, and the image data generated by the processing circuitry 150 including the image generating function 136, for example. The memory 132 is a semiconductor memory device, such as a RAM and a flash memory, a hard disk, or an optical disc, for example.

The processing circuitry 150 causes the control function 133 to collectively control the MRI apparatus 100 and controls capturing, generating, and displaying an image, for example. The processing circuitry 150 including the control function 133 receives input of imaging conditions (e.g., imaging parameters) on the GUI and generates the sequence information based on the received imaging conditions, for example. The processing circuitry 150 including the control function 133 transmits the generated sequence information to the sequence control circuitry 120. The processing circuitry 150 causes the image generating function 136 to read the k-space data from the memory 132 and perform reconstruction, such as Fourier transform, on the read k-space data, thereby generating an image.

The processing functions performed by the interface function 131, the control function 133, and the image generating function 136 according to the present embodiment are stored in the memory 132 in a form of computer-executable programs. The processing circuitry 150 is a processor that reads and executes the computer programs from the memory 132 to implement the functions corresponding to the respective computer programs. In other words, the processing circuitry 150 having read the computer programs has the functions included in the processing circuitry 150 in FIG. 1. While the single processing circuitry 150 implements the processing functions performed by the interface function 131, the control function 133, and the image generating function 136 in FIG. 1, the processing circuitry 150 may be a combination of a plurality of independent processors. In this case, the processors may execute the computer programs, thereby implementing the functions. In other words, the functions described above may be provided as the respective computer programs, and the single processing circuitry 150 may execute the computer programs. Alternatively, a specific function may be installed in a corresponding independent computer program execution circuitry, for example.

Explanation of Coupling and Decoupling

Figure 2:
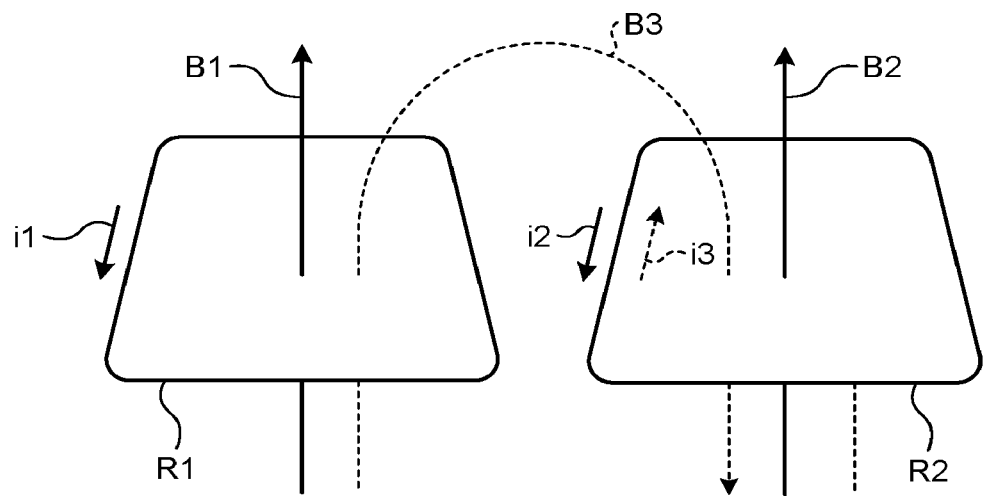
FIG. 2 is a diagram for explaining coupling occurring when two elements are disposed closer to each other.
Figure 3:
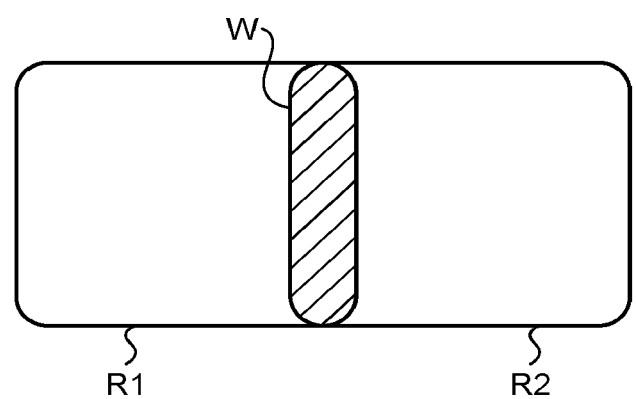
FIG. 3 is a diagram for explaining decoupling of suppressing coupling.

FIG. 2 is a diagram for explaining coupling occurring when two elements are disposed closer to each other. FIG. 3 is a diagram for explaining decoupling of suppressing coupling. As illustrated in FIG. 2, loop elements R1 and R2 having the same area are disposed closer to each other without overlapping. In this case, magnetic flux B1 due to a magnetic field generated from the subject P passes through the element R1. As a result, a radio frequency current it induced by the magnetic flux B1 flows in the element R1. In the same manner, magnetic flux B2 due to a magnetic field generated from the subject P passes through the element R2. As a result, a radio frequency current i2 induced by the magnetic flux B2 flows in the element R2.

In the element R1, another magnetic field is generated by the induced radio frequency current i1. As illustrated in FIG. 2, magnetic flux B3 of this magnetic field, for example, passes through the adjacent element R2. As a result, a radio frequency current i3 (induced current) in a direction opposite to the radio frequency current i2 induced by the magnetic flux B3 flows in the element R2. The radio frequency current i3 flows in a direction opposite to the radio frequency current i2. Also in the element R1, an induced current induced by the magnetic flux from the element R2 flows, which is not illustrated in FIG. 2. As described above, the induced currents flow between the elements disposed side by side due to mutual induction between the elements. In other words, what is called coupling occurs.

As illustrated in FIG. 3, coupling can be suppressed by overlapping part of the elements disposed side by side, that is, forming an overlapping region W. By overlapping the elements R1 and R2 disposed side by side, an induced current component generated by the magnetic flux from the adjacent element passing through the part other than the overlapping part of a certain element is cancelled out by an induced current component generated by the magnetic flux from the adjacent element passing through the overlapping part of the certain element in each of the elements. In other words, this structure exerts a decoupling function.

An overlapping amount sufficient to exert the decoupling function is uniquely determined based on the areas of the elements R1 and R2, for example. If the area of the overlapping region W is substantially 10% the area of the element R1, for example, coupling can be suppressed.

Explanation of the Structure of the Unit Element Included in the Array Coil

Figure 4A:
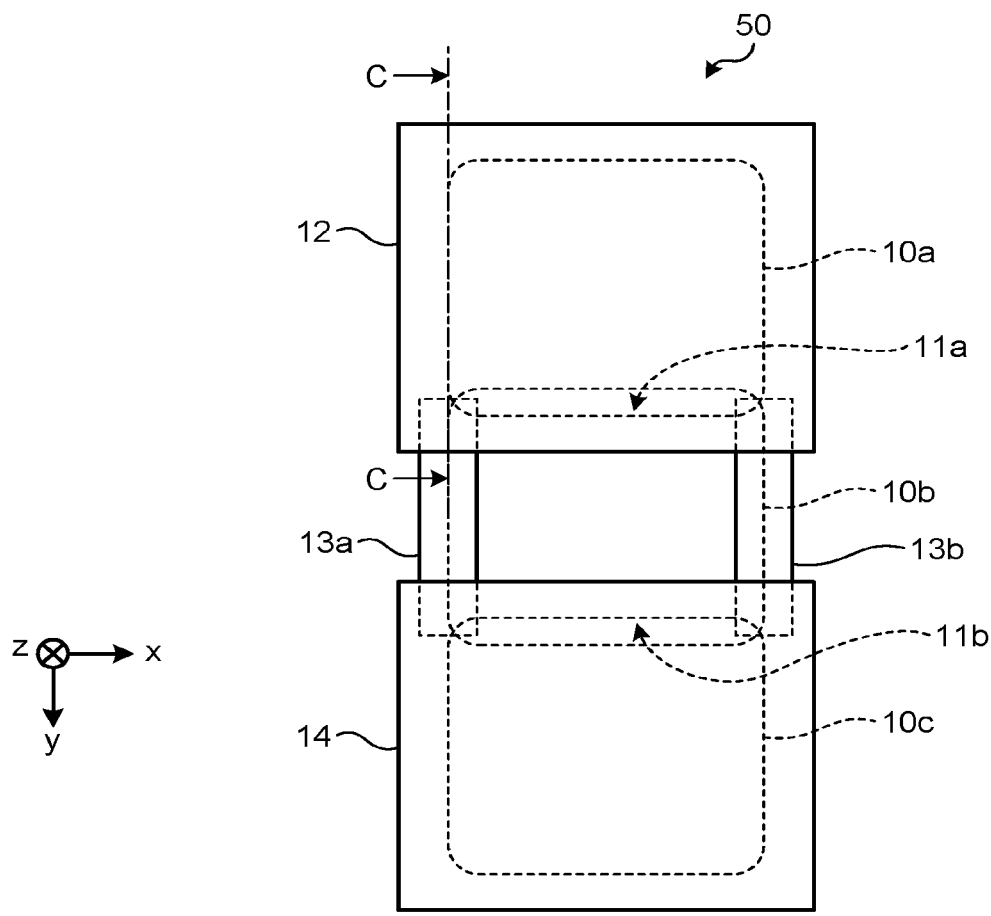
FIG. 4A is a first view of a schematic configuration of a unit element included in the array coil according to an embodiment.
Figure 4B:
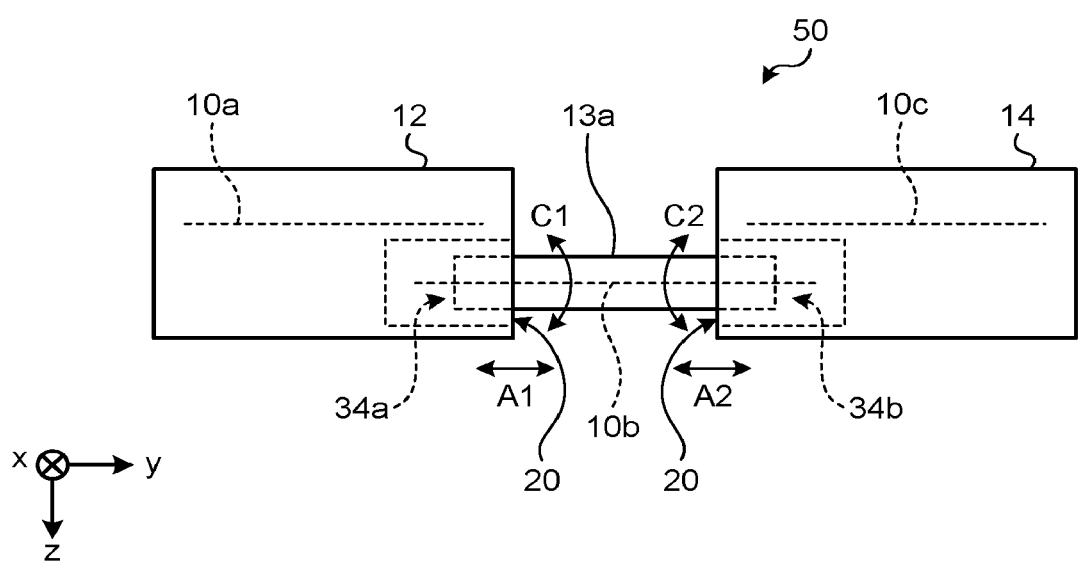
FIG. 4B is a second view of the schematic configuration of the unit element included in the array coil according to the embodiment.

FIGS. 4A and 4B are views of a schematic configuration of a unit element 50 included in the array coil 200 according to the embodiment. The array coil 200 included in the MRI apparatus 100 has a structure composed of the unit elements 50 connected longitudinally and laterally.

FIG. 4A is a plan view of the unit element 50. FIG. 4B is a left side view of the unit element 50. The unit element 50 includes a first element 10a, a second element 10b, and a third element 10c. In the first element 10a, the second element 10b, and the third element 10c, coil surfaces are disposed along the x-y plane of the coordinate system xyz different from the coordinate system XYZ illustrated in FIG. 1. The first element 10a is an example of the first coil element. The second element 10b is an example of the second coil element. The third element 10c is an example of the third coil element.

The first element 10a is a loop coil made of conductive material. The first element 10a receives the MR signals and outputs signals corresponding to the received MR signals. While a signal line that outputs the signals corresponding to the received MR signals is connected to the first element 10a, it is not illustrated in FIG. 4A.

A first housing 12 supports the first element 10a. The first housing 12 is made of insulating material, for example.

The first element 10a is fixed in the first housing 12. The first housing 12 is a rigid body and keeps the shape of the first element 10a accommodated in the first housing 12 when the first housing 12 is brought into close contact with the subject P.

The second element 10b is a loop coil made of conductive material. The second element 10b receives MR signals and outputs signals corresponding to the received MR signals. While a signal line that outputs the signals corresponding to the received MR signals is connected to the second element 10b, it is not illustrated in FIG. 4A.

Second housings 13a and 13b support the second element 10b. In the example illustrated in FIG. 4A, the second housings 13a and 13b support the second element 10b in a manner facing each other. The second housings 13a and 13b are made of insulating material, for example.

Parts of the second element 10b facing each other are fixed in the second housings 13a and 13b. The second housings 13a and 13b may be a rigid or non-rigid body. While a signal line that outputs the signals corresponding to the received MR signals is connected to the third element 10c, it is not illustrated in FIG. 4A.

The third element 10c is a loop coil made of conductive material. The third element 10c receives MR signals and outputs signals corresponding to the received MR signals. While a signal line that outputs the signals corresponding to the received MR signals is connected to the third element 10c, it is not illustrated in FIG. 4A.

A third housing 14 supports the third element 10c. The third housing 14 is made of insulating material, for example.

The third element 10c is fixed in the third housing 14. The third housing 14 is a rigid body and keeps the shape of the third element 10c accommodated in the third housing 14 when the third housing 14 is brought into close contact with the subject P. When the unit element 50 is brought into contact with the subject P and receives the MR signals, the elements usually output the signals having different intensities. In other words, the first element 10a, the second element 10b, and the third element 10c have different reception sensitivity distributions.

As illustrated in FIG. 4B, the second housing 13a is inserted into an opening 20 formed in the first housing 12. The second housing 13a is connected to the first housing 12 by a first connector 34a. The first connector 34a connects the first housing 12 and the second housing 13a such that the positions of the first element 10a and the second element 10b can be changed with an overlapping part 11a (FIG. 4A) provided therebetween. The first connector 34a has flexibility and connects the second housing 13a to the first housing 12 such that the angle of the second housing 13a can be changed in the arrow C1 directions. Furthermore, the first connector 34a connects the second housing 13a to the first housing 12 such that the second housing 13a can be slid in the arrow A1 directions. The first connector 34a also connects the first housing 12 and the second housing 13b by the same structure. The structure and the action of the first connector 34a will be described later in greater detail.

The second housing 13a is also inserted into an opening 20 formed in the third housing 14. The second housing 13a is connected to the third housing 14 by a second connector 34b having the same structure as the first connector 34a. The second connector 34b has flexibility and connects the second housing 13a and the third housing 14 such that the positions of the second element 10b and the third element 10c can be changed with an overlapping part 11b (FIG. 4A) provided therebetween. The second connector 34b connects the second housing 13a to the third housing 14 such that the angle of the second housing 13a can be changed in the arrow C2 directions. Furthermore, the second connector 34b connects the second housing 13a to the third housing 14 such that the second housing 13a can be slid in the arrow A2 directions. The second connector 34b also connects the second housing 13b and the third housing 14 by the same structure.

As described above, the second housings 13a and 13b serve as a plurality of bridges that couple the first housing 12 and the third housing 14. The second element 10b is mounted along the bridges.

The first connector 34a and the second connector 34b and the second housings 13a and 13b sandwiched between the first connector 34a and the second connector 34b serve as a joint that can change the position of the unit element 50.

The positions of the coil surfaces of the first element 10a, the second element 10b, and the third element 10c are positioned closer to each other in the z-axis direction, which are illustrated in an exaggerated manner in FIG. 4B.

In the unit element 50, the overlapping part 11a of the first element 10a and the second element 10b performs decoupling of suppressing an induced current generated in the second element 10b by an electric current flowing in the first element 10a. The overlapping part 11b of the second element 10b and the third element 10c performs decoupling of suppressing an induced current generated in the second element 10b by an electric current flowing in the third element 10c.

Explanation of the Structure of the Second Element

Figure 5A:
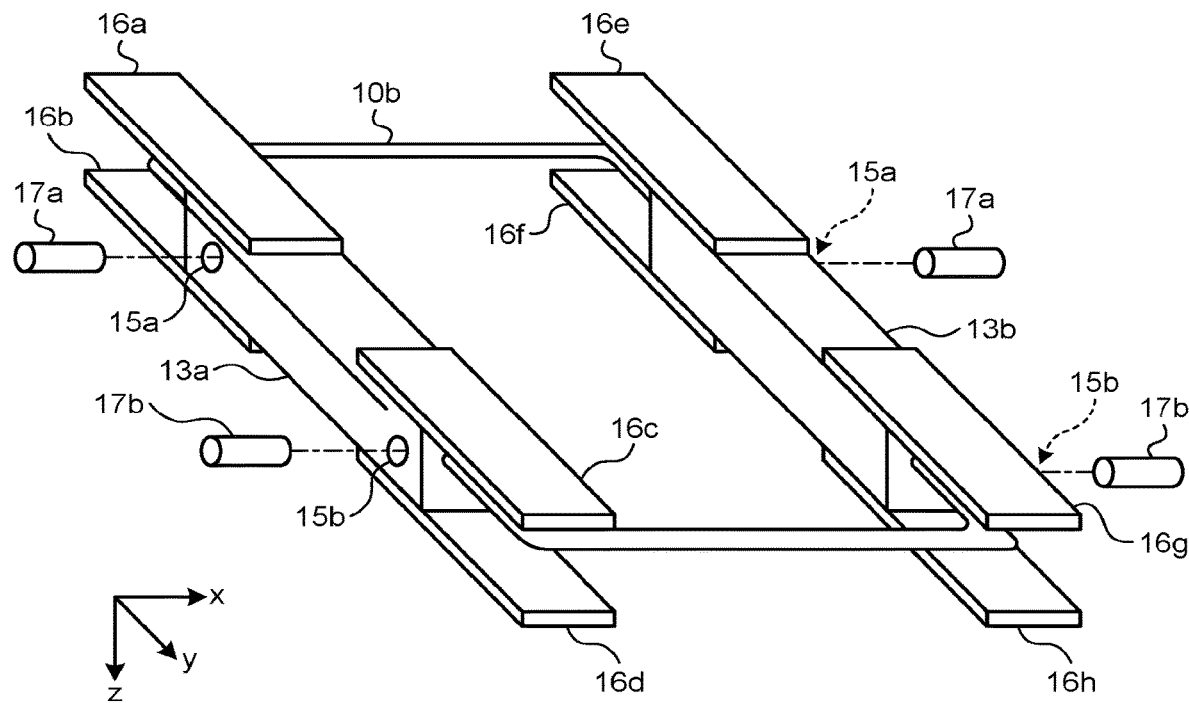
FIG. 5A is a first view of an exemplary structure of a second element.
Figure 5B:
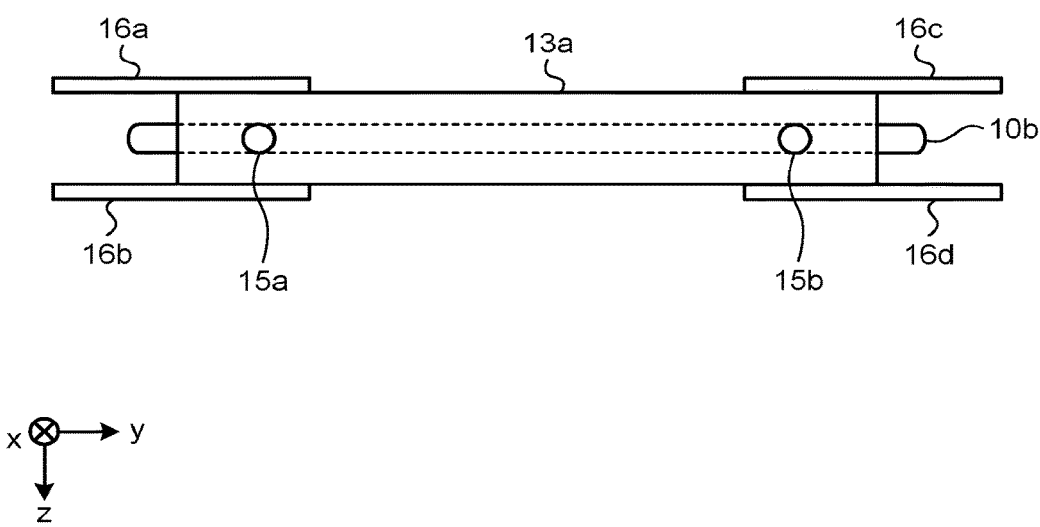
FIG. 5B is a second view of the exemplary structure of the second element.

The following describes the structure of the second element 10b in greater detail with reference to FIGS. 5A and 5B. FIGS. 5A and 5B are views of an exemplary structure of the second element 10b. FIG. 5A is a perspective view of the second element 10b. FIG. 5B is a left side view of the second element 10b.

As illustrated in FIG. 5A, at least parts of the second element 10b extending along the y-axis direction and facing each other are accommodated in the second housings 13a and 13b. One end (in the negative direction of the y-axis) of the second housing 13a is provided with thin-plate flexible members 16a and 16b on the upper and lower surfaces. One end of the flexible members 16a and 16b in the positive direction of the y-axis is bonded or screwed to the second housing 13a. The other end of the flexible members 16a and 16b in the negative direction of the y-axis protrudes from the end of the second housing 13a. As illustrated in FIG. 5B, the amounts of protrusion of the flexible members 16a and 16b are substantially equal.

In the same manner, the other end (in the positive direction of the y-axis) of the second housing 13a is provided with thin-plate flexible members 16c and 16d on the upper and lower surfaces. One end of the flexible members 16c and 16d in the negative direction of the y-axis is bonded or screwed to the second housing 13a. The other end of the flexible members 16c and 16d in the positive direction of the y-axis protrudes from the end of the second housing 13a. As illustrated in FIG. 5B, the amounts of protrusion of the flexible members 16c and 16d are substantially equal.

In the same manner as described above, the second housing 13b is provided with flexible members 16e and 16f at one end and flexible members 16g and 16h at the other end.

Figure 6A:
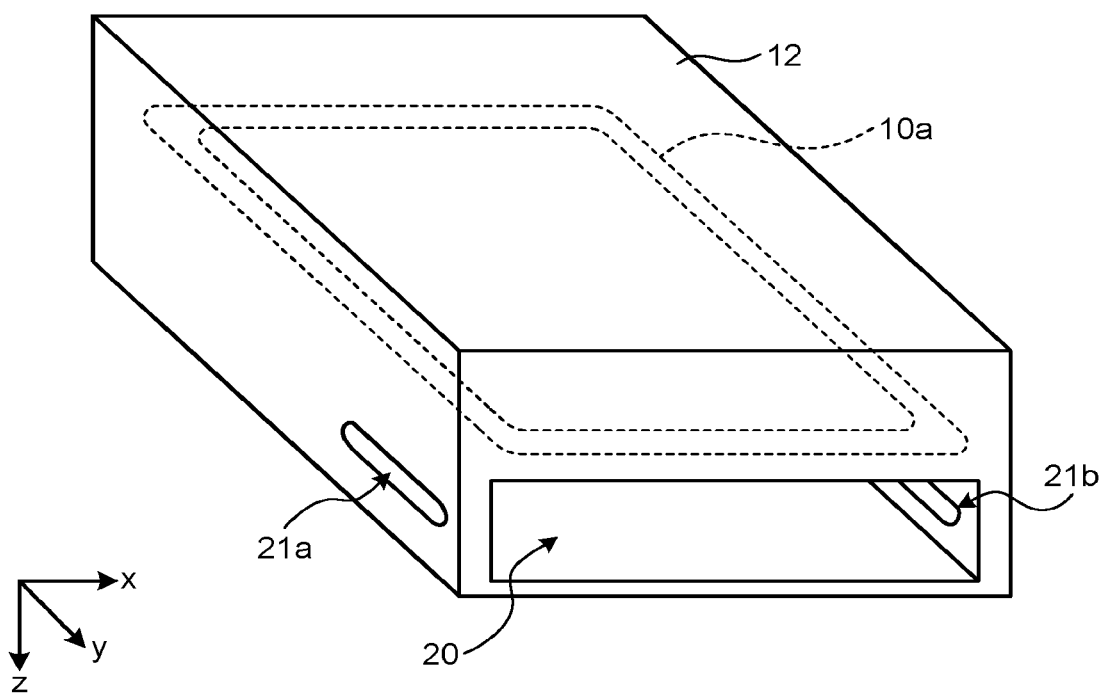
FIG. 6A is a first view of an exemplary structure of a first housing.

The second housing 13a has locking holes 15a and 15b formed near both ends on the surface in the negative direction of the x-axis at positions away from both ends by a substantially equal distance. When the second housing 13a is inserted into the opening 20 (FIG. 6A) of the first housing 12, which will be described later, a stopper pin 17a is inserted into the locking hole 15a through a slide guide hole 21a (FIG. 6A). As a result, the second housing 13a is fixed to the first housing 12 in a slidable manner. In other words, the second housing 13a can slide in directions along the y-axis with respect to the first housing 12 by the stopper pin 17a sliding along the slide guide hole 21a. The second housing 13b is also fixed to the first housing 12 in a slidable manner by the same structure as the second housing 13a.

In the same manner as described above, when the second housing 13a is inserted into the opening 20 of the third housing 14, a stopper pin 17b is inserted into the locking hole 15b through a slide guide hole 21b (FIG. 6A). As a result, the second housing 13a is fixed to the third housing 14 in a slidable manner.

Explanation of the Structure of the First Housing

Figure 6B:
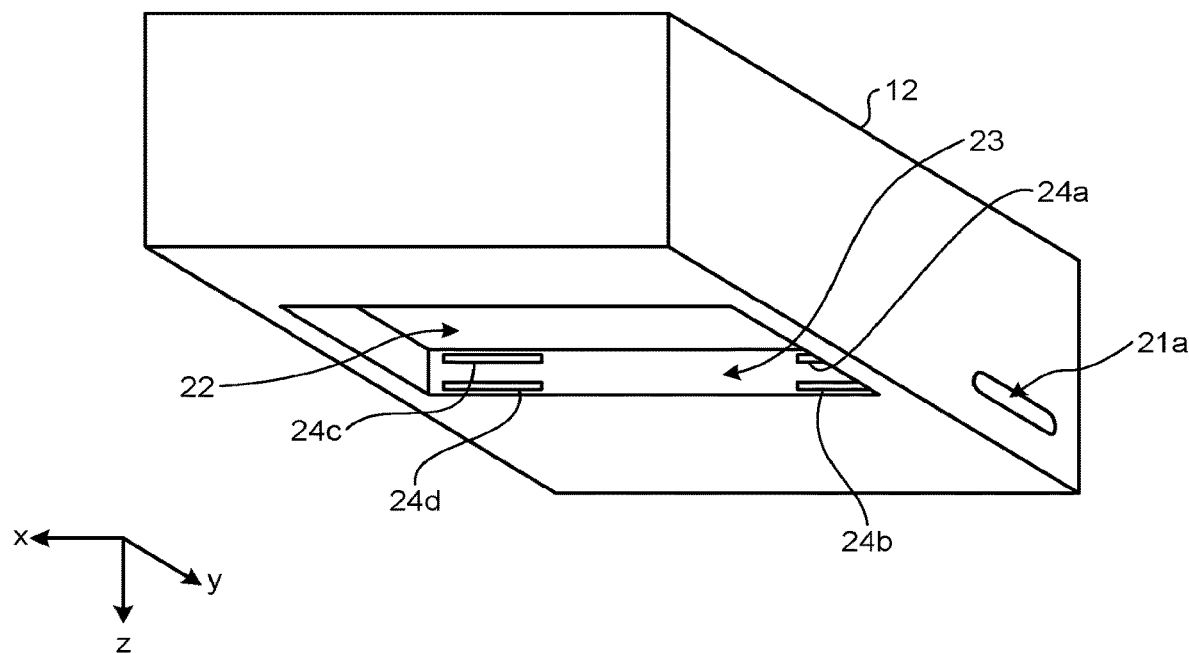
FIG. 6B is a second view of the exemplary structure of the first housing.
Figure 6C:
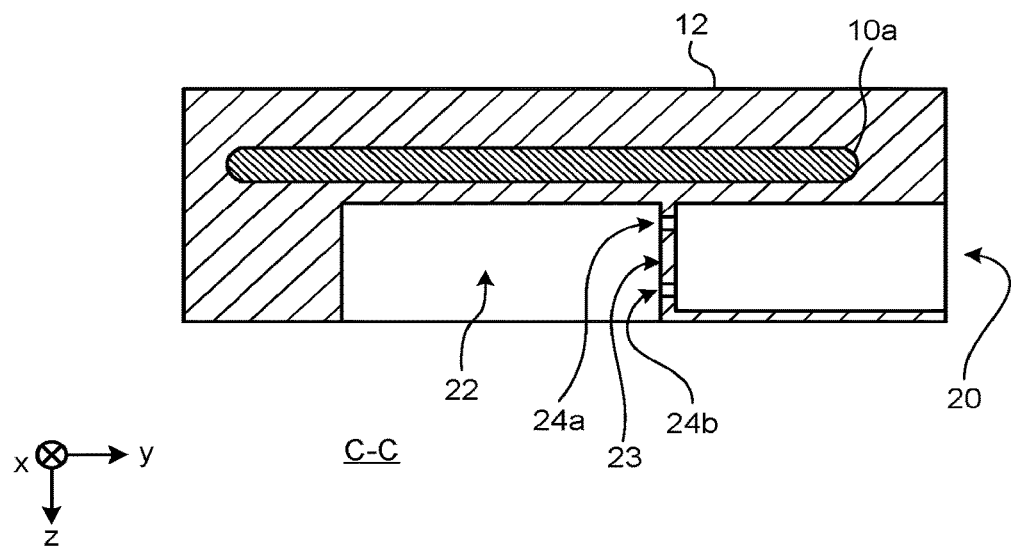
FIG. 6C is a third view of the exemplary structure of the first housing.

The following describes the structure of the first housing 12 with reference to FIGS. 6A, 6B, and 6C. FIGS. 6A, 6B, and 6C are views of an exemplary structure of the first housing. FIG. 6A is a perspective view of the first housing 12 viewed from the top. FIG. 6B is a perspective view of the first housing 12 viewed from the bottom. FIG. 6C is a y-z sectional view along line C-C of FIG. 4A.

As illustrated in FIG. 6A, the first housing 12 has the opening 20 on the wall surface in the positive direction of the y-axis. The second element 10b can be inserted into the opening 20. The first element 10a is accommodated above the opening 20, that is, in the negative direction of the z-axis.

The wall surface of the opening 20 in the negative direction of the x-axis has the slit-like slide guide hole 21a extending toward the inner side of the opening 20, that is, along the y-axis. In the same manner, the wall surface of the opening 20 in the positive direction of the x-axis has the slide guide hole 21b. The slide guide holes 21a and 21b have the same shape and are formed at the same position in the y-axis direction and the z-axis direction. The slide guide holes 21a and 21b have a size sufficiently large for the stopper pins 17a and 17b to pass therethrough.

The third housing 14 has the same structure as the first housing 12. In other words, the third housing 14 has a structure including the third element 10c instead of the first element 10a in FIGS. 6A to 6C.

As illustrated in FIGS. 6B and 6C, the bottom surface of the first housing 12 has a cavity 22. The end of the cavity 22 in the positive direction of the y-axis has a wall 23 extending along the x-z plane.

The wall 23 has slit-like guide holes 24a, 24b, 24c, and 24d near the ends in the positive direction and the negative direction of the x-axis. The guide holes 24a, 24b, 24c, and 24d have the same size and are parallel to each other. The guide holes 24a and 24b are formed at the same position in the x-axis direction. The guide holes 24c and 24d are formed at the same position in the x-axis direction. As illustrated in FIG. 7B, the guide holes 24a, 24b, 24c, and 24d communicate the opening 20 and the cavity 22 separated by the wall 23.

When the second element 10b is inserted into the opening 20, the flexible members 16a and 16b (FIGS. 5A and 5B) pass through the guide holes 24a and 24b, respectively, and the flexible members 16e and 16f (FIGS. 5A and 5B) pass through the guide holes 24c and 24d, respectively.

Explanation of the Structure of the First Connector

Figure 7A:
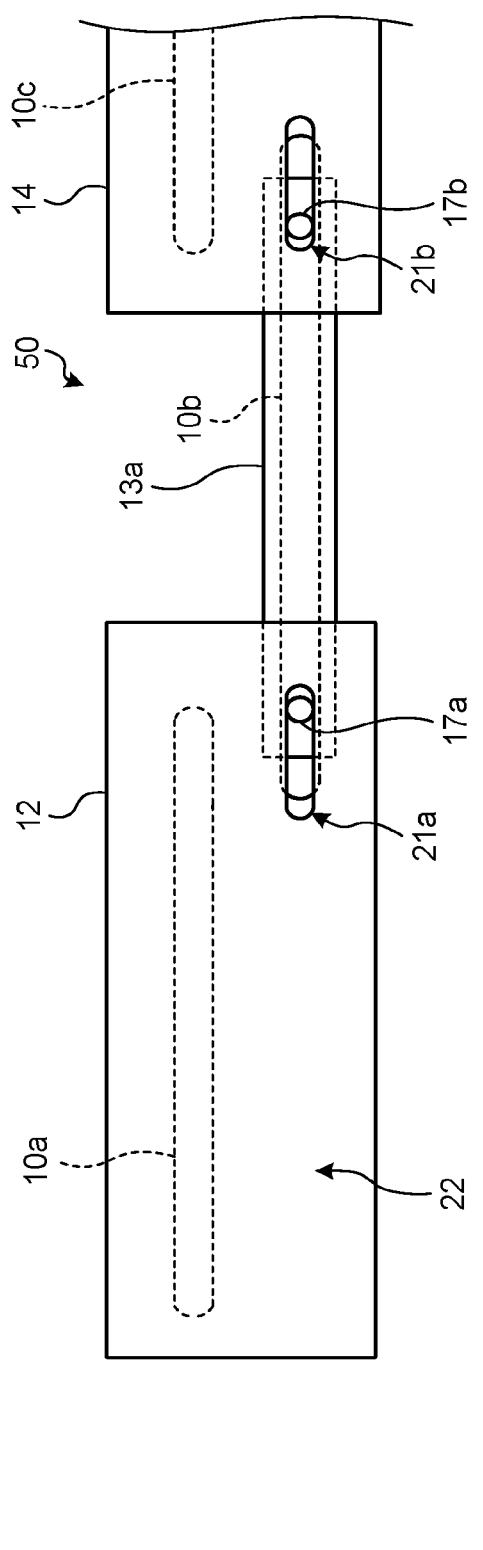
FIG. 7A is a first view of an exemplary structure of a first connector.

FIGS. 7A and 7B are views of an exemplary structure of the first connector 34a. FIG. 7A is a side view of the unit element 50 viewed from the negative side of the x-axis. FIG. 7B is a y-z sectional view along line C-C of FIG. 4A.

As illustrated in FIG. 7A, the end of the second housing 13a in the negative direction of the y-axis is inserted into the first housing 12. The second housing 13a is connected to the slide guide hole 21a in a slidable manner by the stopper pin 17a. In other words, the slide guide hole 21a and the stopper pin 17a serve as a sliding mechanism. The action of the sliding mechanism changes the area of the overlapping part 11a (FIG. 4A) where the coil surfaces of the second element 10b and the first element 10a overlap. The sliding mechanism is an example of a slider.

As illustrated in FIG. 7B, when the second housing 13a is inserted into the opening 20, the flexible member 16a provided to the second housing 13a passes through the guide hole 24a and reaches the cavity 22. In the same manner, the flexible member 16b passes through the guide hole 24b and reaches the cavity 22. Stoppers 25a and 25b are bonded or screwed to the end of the flexible members 16a and 16b on the cavity 22 side. The size of the stoppers 25a and 25b is larger than that of the guide holes 24a and 24b. Consequently, the flexible members 16a and 16b are prevented from moving in the positive direction of the y-axis at the position where the stoppers 25a and 25b come into contact with the wall 23.

As described above, the first housing 12 and the second housing 13a are connected by the slide guide hole 21a and the stopper pin 17a in a slidable manner and by the stoppers 25a and 25b provided at the end of the flexible members 16a and 16b passing through the guide holes 24a and 24b. In other words, these members (the slide guide hole 21a, the stopper pin 17a, the guide holes 24a and 24b, the flexible members 16a and 16b, and the stoppers 25a and 25b) serve as the first connector 34a.

The first housing 12 and the second housing 13b are also connected by the first connector 34a, which is not illustrated.

A height ha of the opening 20 is larger than a height hb of the second housing 13a. Consequently, the inclination of the second housing 13a connected to the first housing 12 by the first connector 34a can be changed in the arrow C1 directions (FIG. 4) described above by a bend of the flexible members 16a and 16b. In other words, the guide holes 24a and 24b, the flexible members 16a and 16b, and the stoppers 25a and 25b included in the first connector 34a serve as an angle adjusting mechanism. The action of the angle adjusting mechanism changes the angle between the coil surfaces of the first element 10a and the second element 10b.

The second housings 13a and 13b are also connected to the third housing 14 by the second connector 34b (not illustrated) having the same structure as the first connector 34a in a slidable and angle-changeable manner, which is not illustrated or explained herein. The angle adjusting mechanism is an example of an angle adjuster.

Explanation of the Function of the First Connector

Figure 8:
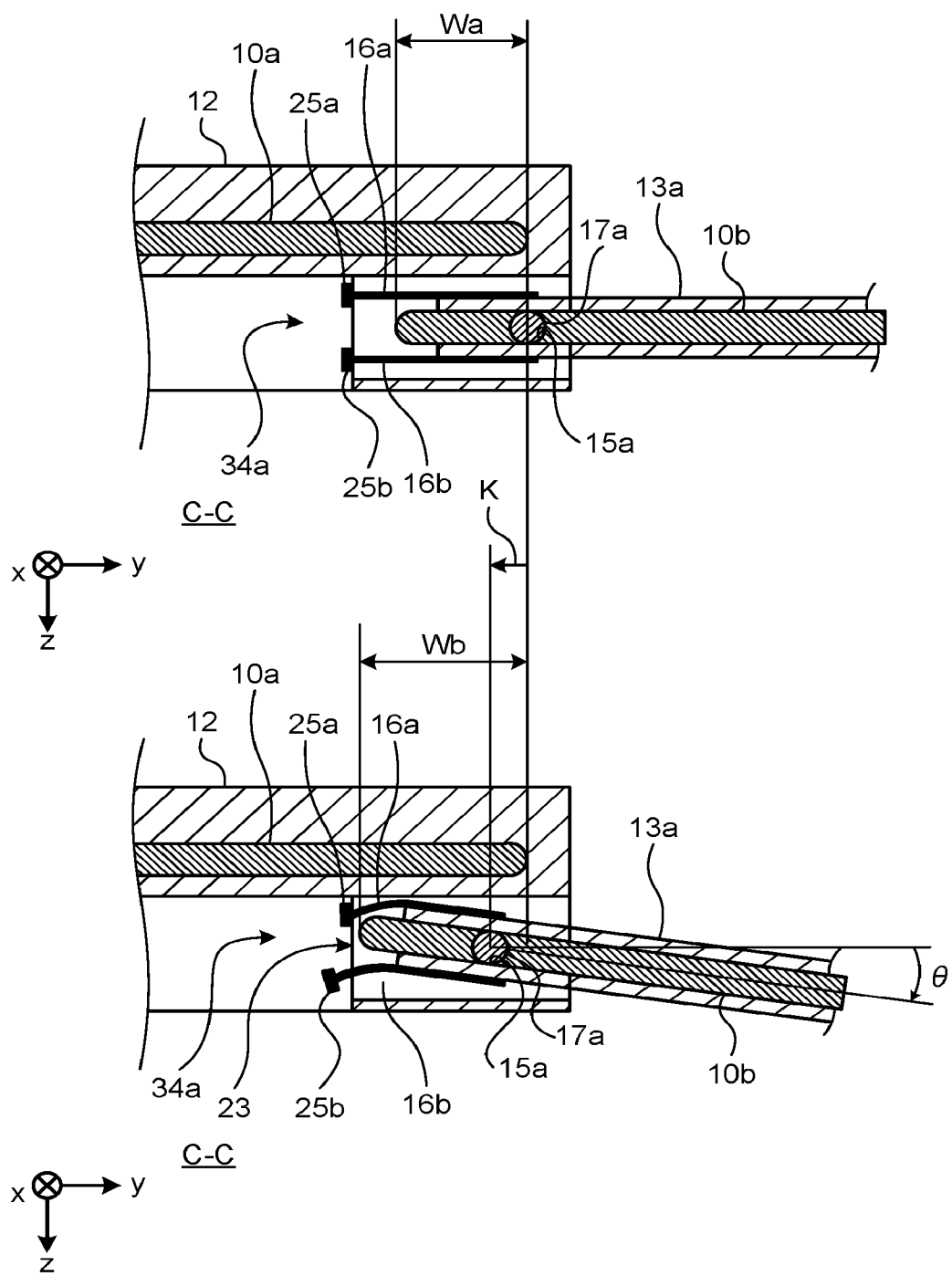
FIG. 8 is a view of a structure in which the inclination and the amount of slide of a second housing change in conjunction with an action of the first connector.

FIG. 8 is a view of a structure in which the inclination and the amount of slide of the second housing 13a change in conjunction with the action of the first connector 34a. The upper figure of FIG. 8 illustrates an example where the first housing 12 and the second housing 13a are disposed at an inclination of 0 and with an amount of slide of 0. The lower figure of FIG. 8 illustrates an example where the second housing 13a is inclined at angle θ and slid in the y-axis direction by an amount of slide K with respect to the first housing 12. The following explains only the first housing 12 and the second housing 13a because the first connector 34a that connects the first housing 12 and the second housing 13b acts in the same manner.

When the first housing 12 and the second housing 13a are in the state illustrated in the upper figure of FIG. 8, the second housing 13a is inclined at the angle θ by applying force in the positive direction of the z-axis to the second housing 13a. As a result, as illustrated in the lower figure of FIG. 8, the flexible members 16a and 16b are bent. At this time, the flexible member 16a is pulled in the positive direction of the y-axis depending on the inclination of the second housing 13a. If the second housing 13a is inclined at a predetermined angle or larger, the stopper 25a comes into contact with the wall 23. If the second housing 13a is a rigid body, the second housing 13a cannot be inclined any more.

When the second housing 13a is inclined at the angle θ, the flexible member 16b is also bent in the same manner as the flexible member 16a. The flexible member 16b, however, is pushed in the negative direction of the y-axis due to the inclination of the second housing 13a in the positive direction of the z-axis. As a result, the stopper 25b is separated away from the wall 23 and moves in the negative direction of the y-axis.

If force in the positive direction of the z-axis is further applied to the second housing 13a when the stopper 25a comes into contact with the wall 23, the stopper pin 17a is slid in the negative direction of the y-axis along the slide guide hole 21a (FIG. 7A). As a result, the second housing 13a moves in the negative direction of the y-axis by the amount of slide K. The second housing 13a stops at the position where the force of sliding the second housing 13a in the negative direction of the y-axis is in balance with the force of inclining the second housing 13a in the positive direction of the z-axis. In other words, if the second housing 13a is inclined with respect to the first housing 12, the second housing 13a is slid toward the first housing 12 in conjunction with the inclination. As a result, the second housing 13a is inclined at the angle θ and slid by the amount of slide K with respect to the first housing 12.

With the change in the position of the second housing 13a, the first element 10a and the second element 10b overlap with the angle θ formed therebetween. When the first element 10a and the second element 10b are inclined, the area of the overlapping part 11a changes compared with the case where the inclination is θ. If the area of the overlapping part 11a changes, the amount of magnetic flux passing through the overlapping part 11a changes. As a result, the advantageous effects of decoupling described above fail to be maintained.

If the unit element 50 according to the present embodiment is deformed such that the first housing 12 and the second housing 13a form the angle θ therebetween, the second housing 13a moves toward the first housing 12 by the amount of slide K in conjunction with the change in the angle.

If the first element 10a and the second element 10b overlap in a manner being inclined as described above, changing the area of the overlapping part 11a can adjust the amount of magnetic flux passing through the overlapping part 11a. In other words, the unit element 50 can maintain the advantageous effects of decoupling independently of the positional relation between the first housing 12 and the second housing 13a.

If the second housing 13a is inclined in the opposite direction (negative direction of the z-axis), which is not illustrated, the first connector 34a acts in the same manner as described above.

The second connector 34b that connects the second housings 13a and 13b and the third housing 14 acts in the same manner as the first connector 34a.

Figure 9A:
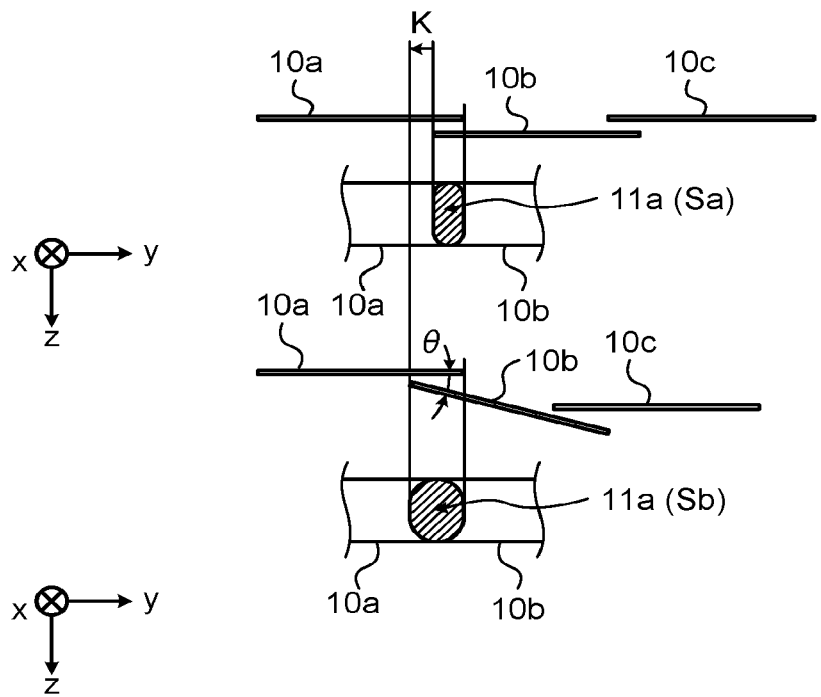
FIG. 9A is a first view for explaining a state where the inclination and the amount of slide of the second housing with respect to the first housing and a third housing change due to the action of the first connector and a second connector.
Figure 9B:
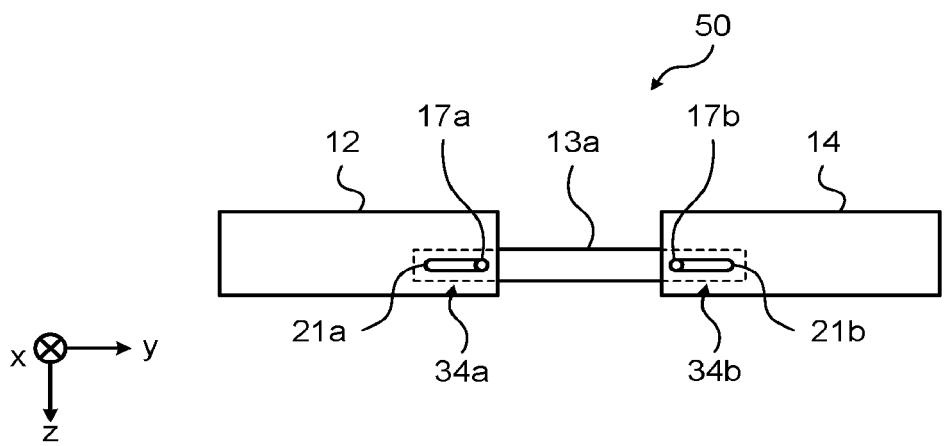
FIG. 9B is a second view for explaining the state where the inclination and the amount of slide of the second housing with respect to the first housing and the third housing change due to the action of the first connector and the second connector.
Figure 9C:
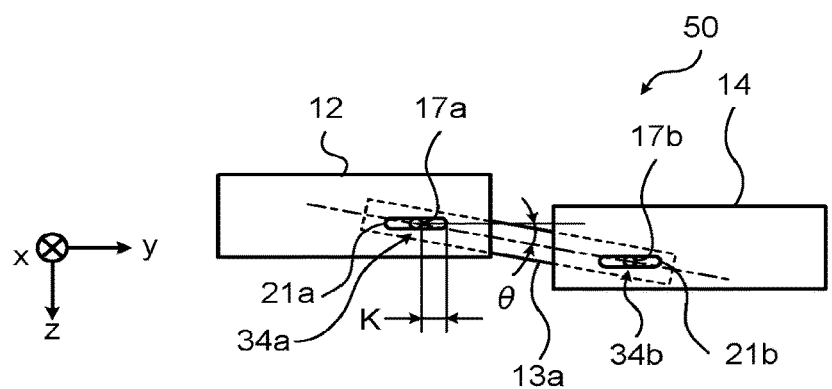
FIG. 9C is a third view for explaining the state where the inclination and the amount of slide of the second housing with respect to the first housing and the third housing change due to the action of the first connector and the second connector.
Figure 10A:
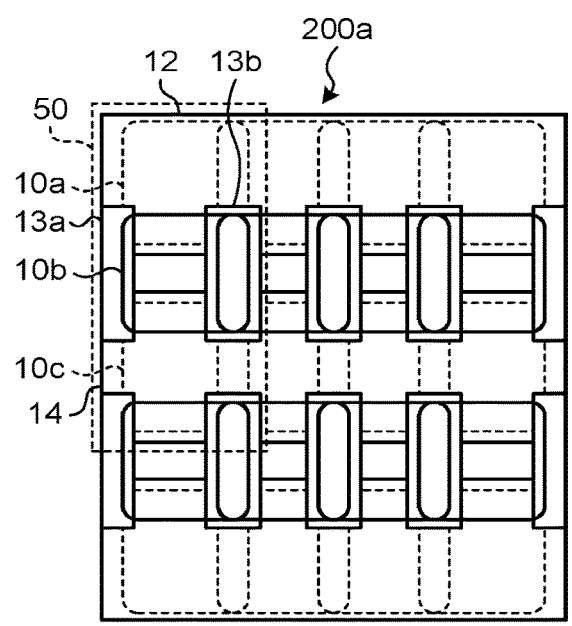
FIG. 10A is a first view of an exemplary configuration of the array coil actually applied.

FIGS. 9A, 9B, and 9C are views for explaining a state where the inclination and the amount of slide of the second housing 13a with respect to the first housing 12 and the third housing 14 change due to the action of the first connector 34a and the second connector 34b. FIG. 9A is a side view of an example of the positions of the coil surfaces of the first element 10a, the second element 10b, and the third element 10c. FIG. 10A does not illustrate the members other than the elements. FIGS. 9B and 9C are side views indicating the positional relation among the first housing 12, the second housing 13a, and the third housing 14 when the elements are in the positional relation illustrated in FIG. 10A. FIG. 9B is a side view indicating the positional relation among the housings when the inclinations of all the elements are 0. FIG. 9C is a side view indicating the positional relation among the housings when the first element 10a and the second element 10b, and the second element 10b and the third element 10c have an inclination of the angle θ.

The upper figure of FIG. 9A illustrates a state where the unit element 50 is disposed such that the coil surfaces of the first element 10a and the second element 10b form an angle of θ and that the coil surfaces of the second element 10b and the third element 10c form an angle of 0. In this state, as illustrated in FIG. 9B, the second housing 13a is pulled farthest from the first housing 12 in the positive direction of the y-axis and farthest from the third housing 14 in the negative direction of the y-axis. In other words, the stopper pin 17a is positioned at the end of the slide guide hole 21a in the positive direction of the y-axis in the first housing 12. The stopper pin 17b is positioned at the end of the slide guide hole 21b in the negative direction of the y-axis in the third housing 14.

In this state, as illustrated in the upper figure of FIG. 9A, the first element 10a and the second element 10b are disposed such that the overlapping part 11a has an overlapping area Sa. The overlapping area Sa is a size of the overlapping region where the first element 10a overlaps the second element 10b. The second element 10b and the third element 10c are also disposed such that the overlapping part 11b (FIG. 4A) has the overlapping area Sa, which is not illustrated in FIG. 9A. The unit element 50 disposed in this state exerts the advantageous effects of decoupling.

By contrast, the lower figure of FIG. 9A and FIG. 9C illustrate an example where the second housing 13a is inclined with respect to the first housing 12 and the third housing 14 at the angle θ.

In this state, the second housing 13a forms the angle θ with respect to the first housing 12, and the stopper pin 17a moves along the slide guide hole 21a in the negative direction of the y-axis by the amount of slide K.

At this time, the second housing 13a moves in the negative direction of the y-axis, whereby the second element 10b moves toward the first elements 10a. As a result, the first elements 10a and the second element 10b overlap forming the angle θ therebetween and having an overlapping area Sb (Sb>Sa).

As described above, by inclining the second housing 13a with respect to the first housing 12 in the unit element 50, the second housing 13a moves in the negative direction of the y-axis in conjunction with an increase in inclination. In other words, the overlapping area of the overlapping part 11a of the first element 10a and the second element 10b increases in conjunction with an increase in the angle θ. The overlapping area is the smallest (overlapping area Sa) when the angle θ is 0 and increases with an increase in the angle θ.

In other words, when the angle adjusting mechanism of the first connector 34a increases the angle θ, the sliding mechanism changes the overlapping area of the overlapping part 11a so as to make the area larger. The overlapping part 11a of the first element 10a and the second element 10b exerts the advantageous effects of decoupling within a movable range of the first connector 34a.

The contents qualitatively described above were confirmed by an experiment. First, two rectangular elements having a size of 60 mm×60 mm were disposed at an angle θ between the coil surfaces of 0° and with an overlapping amount Wa of 7.5 mm, that is, in the state corresponding to the upper figure of FIG. 8. When one element was irradiated with a radio wave at a predetermined power (0 dBm (=1 mW)), the power induced in the other element was −20.1 dB.

Next, the same elements were disposed at an angle θ between the coil surfaces of 15° and with an overlapping amount Wb of 9.0 mm, that is, in the state corresponding to the lower figure of FIG. 8. When one element was irradiated with a radio wave at the same power as described above, the power induced in the other element was −22.3 dB. It is found out that if the angle θ between the coil surfaces was inclined, making the overlapping amount Wb larger can maintain the advantageous effects of decoupling. In other words, if the amount of magnetic flux passing through the overlapping part decreases due to inclination of the coil surfaces, making the overlapping amount larger can compensate for the decreased magnetic flux.

Explanation of the Structure of the Array Coil

Figure 10B:
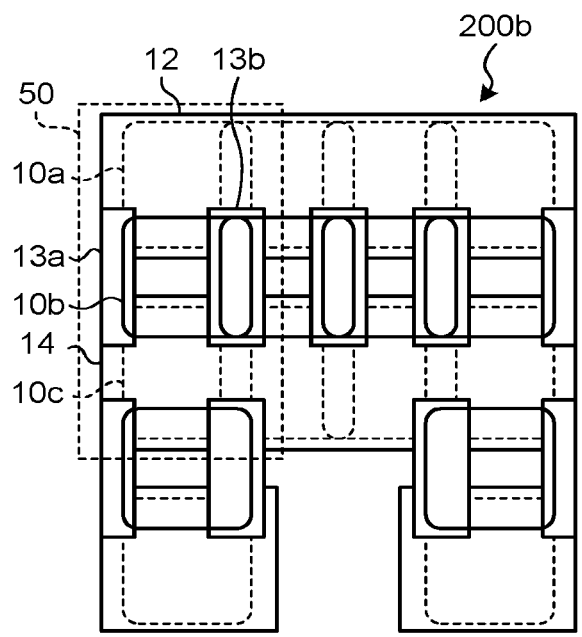
FIG. 10B is a second view of the exemplary configuration of the array coil actually applied.
Figure 10C:
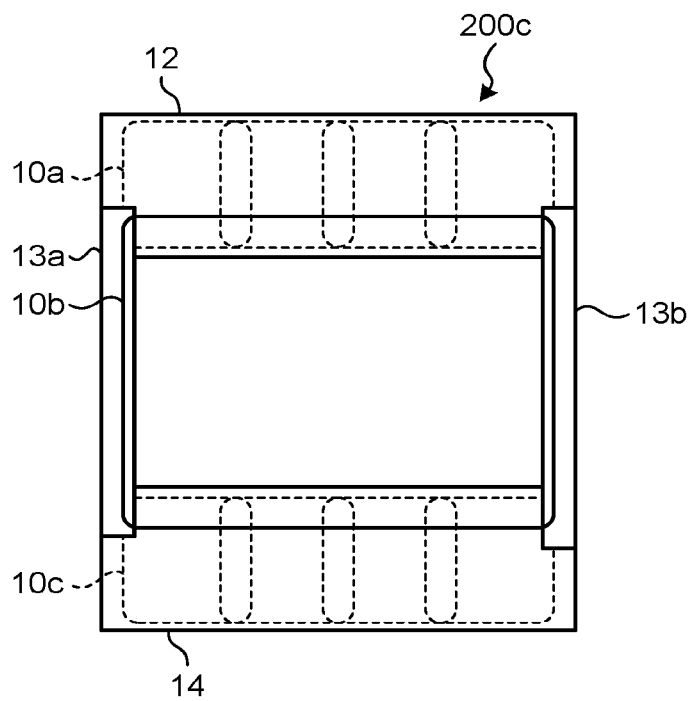
FIG. 10C is a third view of the exemplary configuration of the array coil actually applied.

FIGS. 10A, 10B, and 10C are views of an exemplary configuration of the array coil 200 actually applied. The array coil 200 is composed of the unit elements 50 connected longitudinally and laterally so as to cover the region to be imaged of the subject P.

FIG. 10A illustrates an exemplary configuration of an array coil 200a composed of the unit elements 50 connected in the longitudinal and lateral directions. The array coil 200a is an example obtained by connecting the unit elements 50 longitudinally and laterally without any space therebetween. The number of connected unit elements 50 is not particularly limited.

FIG. 10B illustrates another example obtained by connecting the unit elements 50 longitudinally and laterally. An array coil 200b illustrated in FIG. 10B is an example obtained by changing the number of connected unit elements depending on the positions.

FIG. 10C illustrates an example of an array coil 200c in which the first element 10a and the third element 10c are each composed of a plurality of elements.

As described above, the array coil 200 according to the embodiment receives magnetic resonance signals (MR signals) from the subject P by a plurality of elements including the first element 10a and the second element 10b. The first element 10a is supported by the first housing 12, and the second element 10b is supported by the second housings 13a and 13b. The first housing 12 and the second housings 13a and 13b are rigid bodies. The first housing 12 and the second housings 13a and 13b are connected together by the first connector 34a having flexibility. The first element 10a and the second element 10b have the overlapping part 11a in the first connector 34a. In other words, the embodiment can set the array coil 200 on the subject P such that the first element 10a and the second element 10b keep the shapes and the overlapping part 11a keeps present. Due to this, the embodiment maintains the advantageous effects of decoupling of suppressing an induced current generated in the second element 10b by an electric current flowing in the first element 10a even when the array coil 200 is set along the shape of the subject P, and the embodiment therefore can increase the receiving performance of the array coil 200.

In the unit element 50 of the array coil 200 according to the embodiment, the first housing 12 and the third housing 14 are rigid bodies. When the unit element 50 is mounted around the subject P, neither the first element 10a nor the third element 10c is deformed. This structure can facilitate the mounting of the unit element 50, thereby enabling an operator or other staff to prepare for imaging in a shorter time.

In the unit element 50 of the array coil 200 according to the embodiment, the overlapping part 11a of the first element 10a and the second element 10b performs decoupling of suppressing an induced current generated in the second element 10b by an electric current flowing in the first element 10a. The overlapping part 11b of the second element 10b and the third element 10c performs decoupling of suppressing an induced current generated in the second element 10b by an electric current flowing in the third element 10c. Consequently, the second element 10b supported by the second housings 13a and 13b serving as the joint of the unit element 50 can have the decoupling function.

In the unit element 50 of the array coil 200 according to the embodiment, the second housings 13a and 13b serve as a plurality of bridges that couple the first housing 12 and the third housing 14. The second element 10b is mounted along the bridges. Consequently, by causing the second housings 13a and 13b the positions of which can be changed to support the second element 10b, the joint can have the receiving function.

In the unit element 50 of the array coil 200 according to the embodiment, the first connector 34a and the second connector 34b set the positions of the first element 10a, the second element 10b, and the third element 10c such that the overlapping part 11a of the first element 10a and the second element 10b and the overlapping part 11b of the second element 10b and the third element 10c exert the advantageous effects of decoupling when the first housing 12, the second housing 13a, 13b, and the third housing 14 are brought into close contact with the subject P. Consequently, the embodiment can exert the advantageous effects of decoupling independently of the shape of the subject P.

In the unit element 50 of the array coil 200 according to the embodiment, the first connector 34a and the second connector 34b include an angle adjusting mechanism that changes the angle θ between the first element 10a and the second element 10b and between the second element 10b and the third element 10c. The first connector 34a and the second connector 34b also include a sliding mechanism that changes the area of the overlapping part 11a of the first element 10a and the second element 10b and the overlapping part 11b of the second element 10b and the third element 10c. If the angle θ between the coil surfaces is changed depending on the shape of the subject P by the action of the angle adjusting mechanism, the embodiment can adjust the area of the overlapping parts 11a and 11b by the action of the sliding mechanism so as to exert the advantageous effects of decoupling.

In the unit element 50 of the array coil 200 according to the embodiment, when the angle adjusting mechanism of the first connector 34a and the second connector 34b changes the angle θ of the elements, the sliding mechanism changes the area of the overlapping parts 11a and 11b in conjunction with the change in the angle θ. Consequently, the embodiment can exert the advantageous effects of decoupling independently of the positions of the elements.

In the unit element 50 of the array coil 200 according to the embodiment, when the angle adjusting mechanism of the first connector 34a and the second connector 34b changes the angle θ of the elements so as to make the angle θ larger, the sliding mechanism changes the area of the overlapping parts 11a and 11b so as to make the area larger. Consequently, the embodiment can exert the advantageous effects of decoupling independently of the positions of the elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A radio frequency coil comprising:
a plurality of coil elements configured to receive a magnetic resonance signal from a subject, the coil elements including a first coil element and a second coil element, wherein
the first coil element and the second coil element are supported by a first housing and a second housing, the first housing and the second housing being rigid,
the first housing and the second housing are connected by a flexible connector, and
the first coil element overlaps the second coil element in at least part of the connector.

2. The radio frequency coil according to claim 1, wherein the first coil element and the second coil element keep respective shapes when the connector is deformed.

3. The radio frequency coil according to claim 1, wherein the first coil element and the second coil element have different reception sensitivity distributions.

4. The radio frequency coil according to claim 1, wherein the region where the first coil element overlaps the second coil element is configured to perform decoupling, the decoupling suppressing an induced current generated in the second coil element by an electric current flowing in the first coil element.

5. The radio frequency coil according to claim 1, wherein the connector sets positions of the first coil element and the second coil element such that the region where the first coil element overlaps the second coil element activates decoupling between the first coil element and the second coil element when the first housing and the second housing are brought into close contact with the subject.

6. The radio frequency coil according to claim 1, wherein the connector includes:
an angle adjuster configured to change an angle between the first coil element and the second coil element; and
a slider configured to change a size of the region where the first coil element overlaps the second coil element.

7. The radio frequency coil according to claim 6, wherein, the slider changes the size of the region in conjunction with the change in the angle caused by the angle adjuster.

8. The radio frequency coil according to claim 6, wherein, the slider changes the size of the region to be larger in conjunction with the change in the angle to be larger caused by the angle adjuster.

* * * * *